(12) United States Patent
Kim et al.

(10) Patent No.: US 8,531,594 B2
(45) Date of Patent: Sep. 10, 2013

(54) STRUCTURE FOR FIXING CAMERA MODULE ON BIODRIVE

(75) Inventors: Chung-ung Kim, Yongin-si (KR); Ki-ju Lee, Suwon-si (KR); Jong-jin Park, Yonging-si (KR); Dong-hwi Cho, Suwon-si (KR); Su-bong Bae, Suwon-si (KR); Jong-cheol Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 249 days.

(21) Appl. No.: 12/729,478

(22) Filed: Mar. 23, 2010

(65) Prior Publication Data

US 2010/0245661 A1   Sep. 30, 2010

(30) Foreign Application Priority Data

Mar. 26, 2009   (KR) .................. 10-2009-0025854

(51) Int. Cl.
*H04N 5/225* (2006.01)
(52) U.S. Cl.
USPC ........................... 348/374; 348/340; 348/373
(58) Field of Classification Search
USPC .......................................... 348/340, 373–374
See application file for complete search history.

(56) References Cited

U.S. PATENT DOCUMENTS

| | | | |
|---|---|---|---|
| 7,255,600 B2 | 8/2007 | Ma | |
| 7,304,684 B2* | 12/2007 | Segawa et al. | 348/374 |
| 2003/0070288 A1 | 4/2003 | Ting | |
| 2004/0239794 A1* | 12/2004 | Saito et al. | 348/340 |
| 2005/0078207 A1* | 4/2005 | Minamio et al. | 348/340 |
| 2006/0197862 A1* | 9/2006 | Lung | 348/335 |
| 2007/0291164 A1* | 12/2007 | Goh et al. | 348/370 |
| 2008/0080072 A1 | 4/2008 | Chang | |
| 2008/0119080 A1 | 5/2008 | Wu | |
| 2008/0174692 A1 | 7/2008 | Kusaki et al. | |
| 2008/0278621 A1* | 11/2008 | Cho et al. | 348/374 |
| 2010/0141825 A1* | 6/2010 | Kim et al. | 348/340 |

FOREIGN PATENT DOCUMENTS

| | | |
|---|---|---|
| EP | 1387442 | 2/2004 |
| EP | 1471731 | 10/2004 |
| JP | 2005-176185 | 6/2005 |
| KR | 10-2007-0064696 | 6/2007 |

OTHER PUBLICATIONS

European Search Report mailed Aug. 18, 2010 in corresponding European Application No. 10157133.

* cited by examiner

*Primary Examiner* — Kelly L Jerabek
(74) *Attorney, Agent, or Firm* — Staas & Halsey LLP

(57) ABSTRACT

Provided is a structure for fixing a camera module on a biodrive. The structure includes a socket fixed on a top surface of a printed circuit board (PCB) of the biodrive. The camera module is combined with the socket. A holder member is disposed over the camera module and covers the camera module. A plurality of fixing units may fix the holder member to fix the camera module on the PCB. The structure can prevent distortion and deviation of the camera module due to external shock.

15 Claims, 11 Drawing Sheets

STRUCTURE FOR FIXING CAMERA MODULE ON BIODRIVE

CROSS-REFERENCE TO RELATED APPLICATIONS

This application claims the benefit of Korean Patent Application No. 10-2009-0025854, filed on Mar. 26, 2009, in the Korean Intellectual Property Office, the disclosure of which is incorporated herein in its entirety by reference.

BACKGROUND

The embodiment relates to a structure for fixing a camera module functioning as a detector of a biodrive, and more particularly, to a structure for preventing deviation of a camera module functioning as a detector of a biodrive using a holder member, a buffer material, and a tension member.

In a biodrive system, an image of a detection target of a biodisk may be captured using a camera module and the detection target may be analyzed and diagnosed based on the captured image. However, when a position of the camera module is deviated, a position of the detection target may be changed, thus causing an error in a diagnosis result. Accordingly, a technique of designing a biodrive to prevent deviation of a camera module due to oscillation or an external force is required.

SUMMARY

Additional aspects and/or advantages will be set forth in part in the description which follows and, in part, will be apparent from the description, or may be learned by practice of the invention.

An embodiment or embodiments provide a structure for fixing a camera module on a biodrive to prevent the camera module from being deviated from a socket.

According to an embodiment, there is provided a structure for fixing a camera module on a biodrive. The structure includes a socket fixed on a top surface of a printed circuit board (PCB) of the biodrive. The camera module is combined with the socket. A holder member is disposed over the camera module and covers the camera module. A plurality of fixing units may fix the holder member covering the camera module on the PCB.

A plurality of fixing holes may be formed in upper and lower portions and/or both lateral portions of the holder member and nut-connected to the plurality of fixing units.

A top surface of the camera module may be spaced apart from a bottom surface of the holder member by about 0.1 to 0.15 mm.

The cameral module may have a horizontality degree of about 0.05° or less with respect to the surface of the PCB.

The structure may further include a tension member connected to each of lower corners of the holder member and configured to elastically apply pressure to the camera module.

The structure may further include a buffer material provided in a space between a top surface of the camera module and a bottom surface of the holder member.

The structure may further include a tension member connected to each of lower corners of the holder member and configured to elastically apply pressure to the buffer material.

The buffer material may be formed of at least one selected from the group consisting of rubber, sponge, and polyester.

The tension member may be a tension rib formed of a plastic material.

BRIEF DESCRIPTION OF THE DRAWINGS

These and/or other aspects and advantages will become apparent and more readily appreciated from the following description of the embodiments, taken in conjunction with the accompanying drawings of which.

Example embodiments will be more clearly understood from the following detailed description taken in conjunction with the accompanying drawings in which.

DETAILED DESCRIPTION OF EMBODIMENTS

Figure 1:
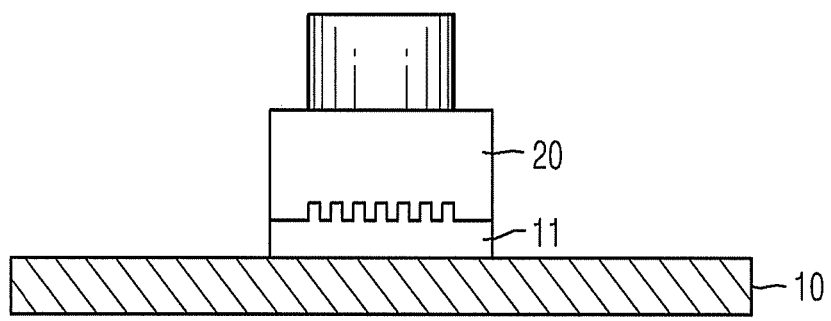
FIG. 1 is a cross-sectional view of a camera module inserted in a socket formed on a printed circuit board (PCB)

Reference will now be made in detail to the embodiments, examples of which are illustrated in the accompanying drawings, wherein like reference numerals refer to the like elements throughout. The embodiments are described below to explain the present invention by referring to the figures.

FIG. 1 is a cross-sectional view of a camera module inserted in a socket formed on a printed circuit board (PCB).

Referring to FIG. 1, a socket 11 having a plurality of press-fit pins may be fixed on a top surface of a printed circuit board (PCB) 10 of a biodrive. A camera module 20 may be combined with the socket 11 so that a plurality of fixing pins of the camera module 20 may be combined with the press-fit pins of the socket 11.

When the camera module 20 is fixed on the PCB 10 only by combining the press-fit pins of the socket 11 with the fixing pins of the camera module 20, although the camera module 20 is primarily fixed on the PCB 10, deviation of the camera module 20 may occur during the combination of the press-fit pins of the socket 11 with the fixing pins of the camera module 20. Also, even if the press-fit pins of the socket 11 are completely combined with the fixing pins of the camera module 20, when external oscillation or an external force, such as shock, is applied during a distribution process, distortion or deviation of the camera module 20 may happen on the PCB 10.

Figure 2A:
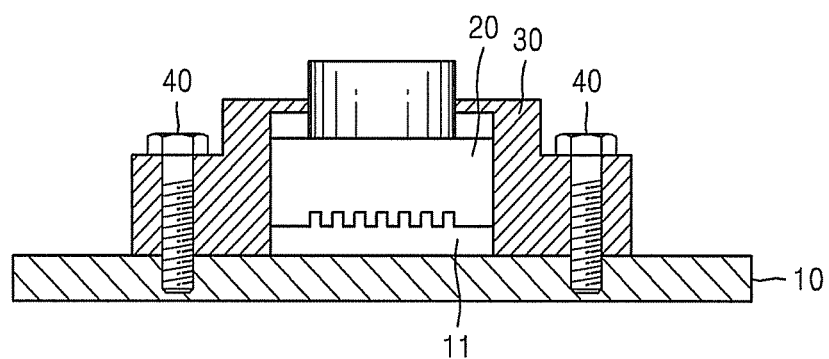
FIG. 2A is a cross-sectional view taken along line A-A' of FIG. 2B, illustrating a structure for fixing a camera module on a biodrive, in which a holder member is mounted over the camera module, according to an example embodiment.
Figure 2B:
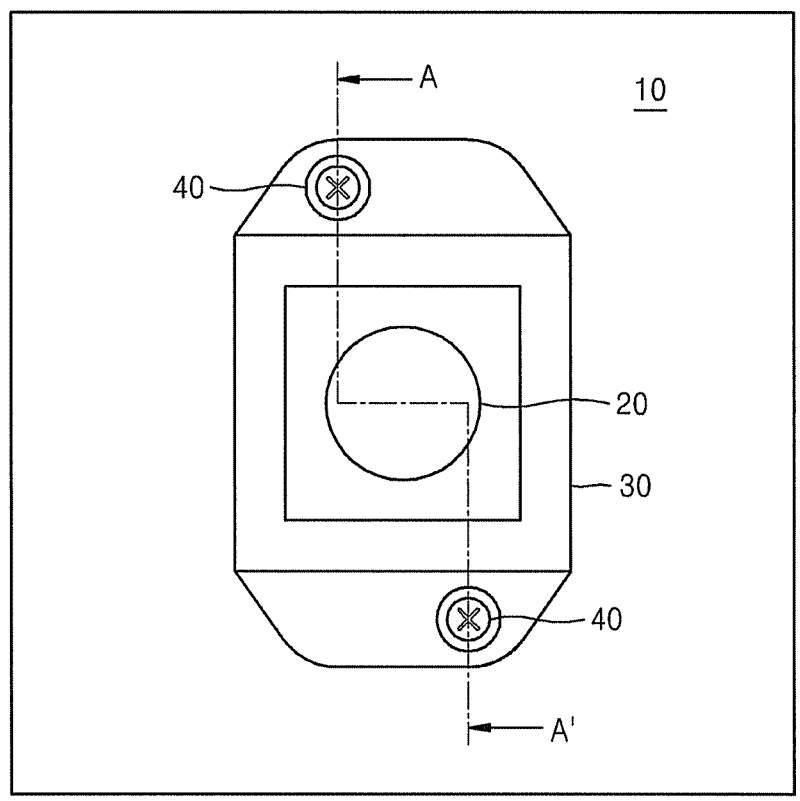
FIG. 2B is a plan view of FIG. 2A, illustrating fixing grooves formed in upper and lower portions of the holder member and connected with fixing portions.

FIG. 2A is a cross-sectional view taken along line A-A' of FIG. 2B, illustrating a structure for fixing a camera module on a biodrive, in which a holder member is mounted over the camera module, according to an example embodiment.

A holder member 30 may be further provided over a camera module 20 combined with a socket 11 and cover the camera module 20 to prevent distortion of the camera module 20 during insertion of a camera module 20 in a socket 11 fixed on a PCB 10 and inhibit deviation of the camera module 20 due to external oscillation or shock. Since the holder member 30 is connected with the PCB 10 using a plurality of fixing units 40, the distortion and deviation of the camera module 10 may be secondarily prevented.

Meanwhile, a space between a top surface of the camera module 20 and a bottom surface of the holder member 30 may be appropriately determined. As the space between the top surface of the camera module 20 and the bottom surface of the holder member 30 increases, sensitivity of the camera module 20 to external shock also increases. Accordingly, the space between the top surface of the camera module 20 and the bottom surface of the holder member 30 may be designed to range from about 0.1 to 0.15 mm.

Also, a horizontality degree of the camera module 20 with respect to a surface of the PCB 10 may be appropriately controlled. The camera module 20 may have a horizontality degree of about 0.05° or less with respect to the surface of the PCB 10.

Figure 2C:
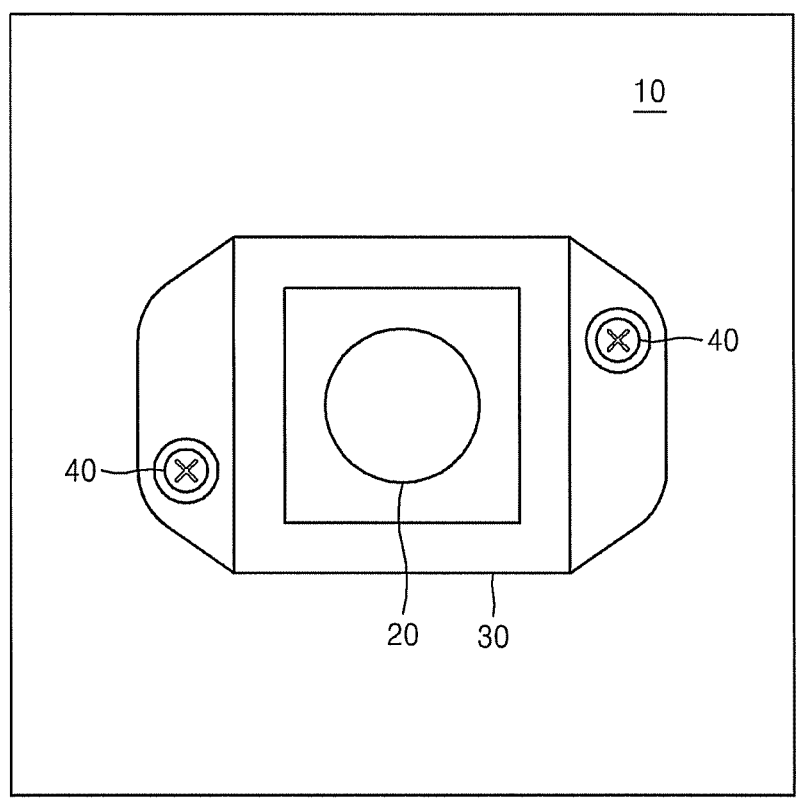
FIG. 2C is a plan view of FIG. 2A, illustrating fixing holes formed in both lateral portions of the holder member and connected with fixing portions.
Figure 2D:
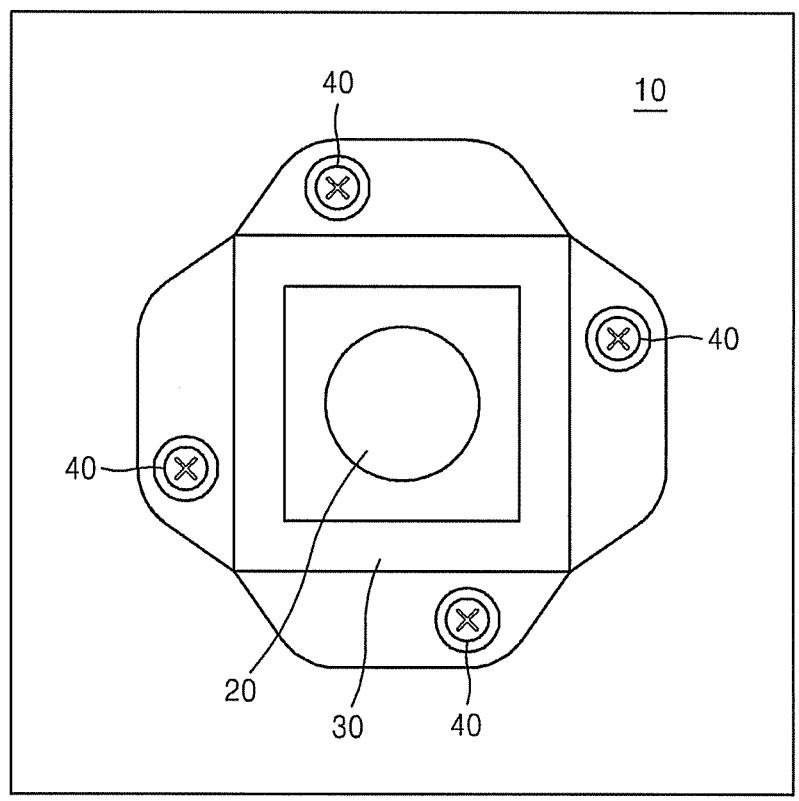
FIG. 2D is a plan view of FIG. 2A, illustrating fixing holes formed in upper and lower portions and both lateral portions of the holder member and connected with fixing portions.

FIGS. 2B through 2D are plan views of FIG. 2A. Specifically, FIG. 2B illustrates fixing holes formed in upper and lower portions of the holder member and connected with fixing portions, FIG. 2C illustrates fixing holes formed in both lateral portions of the holder member and connected with fixing portions, and FIG. 2D illustrates fixing holes formed in upper and lower portions and both lateral portions of the holder member and connected with fixing portions.

A plurality of fixing holes may be formed in upper and lower portions and/or both lateral portions of the holder member 30 and nut-connected with the plurality of fixing units 40.

Referring to FIG. 2B, fixing holes may be formed in upper and lower portions of the holder member 30 so that the holder member 30 may be combined with the PCB 10 using the fixing units 40. In this case, the fixing units 40 may be combined with the fixing holes in the very center of the holder member 30 or in positions that deviate from the center of the holder member 30 at predetermined angles.

In comparison, referring to FIG. 2C, fixing holes may be formed in both lateral portions of the holder member 30 so that the holder member 30 may be combined with the PCB 10 using the fixing units 40. Also, referring to FIG. 2D, fixing holes may be formed in upper and lower portions and both lateral portions of the holder member 30 so that the holder member 30 may be combined with the PCB 10 using the fixing units 40.

The positions and number of fixing holes formed in the holder member 30 may be vary and is not limited to FIGS. 2B through 2D. Accordingly, an example structure in which the holder member 30 is combined with the PCB 10 by combining the fixing holes of the holder member 30 with the fixing units 40 will now be described with reference to FIG. 2B.

Figure 3A:
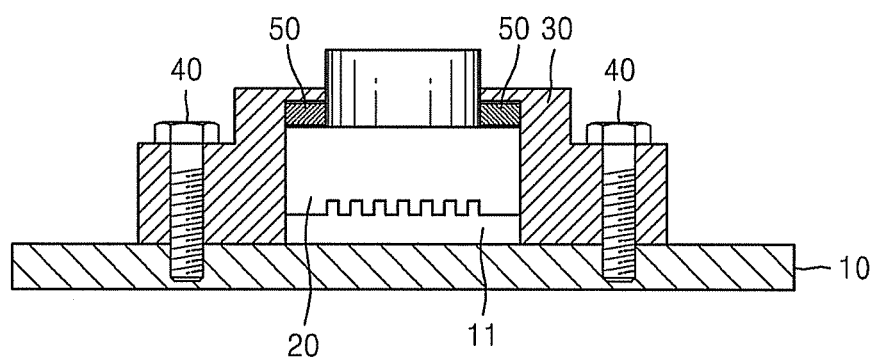
FIG. 3A is a cross-sectional view of a structure for fixing a camera module on a biodrive, illustrating a buffer material provided in a space between a holder member and the camera module, according to an example embodiment.
Figure 3B:
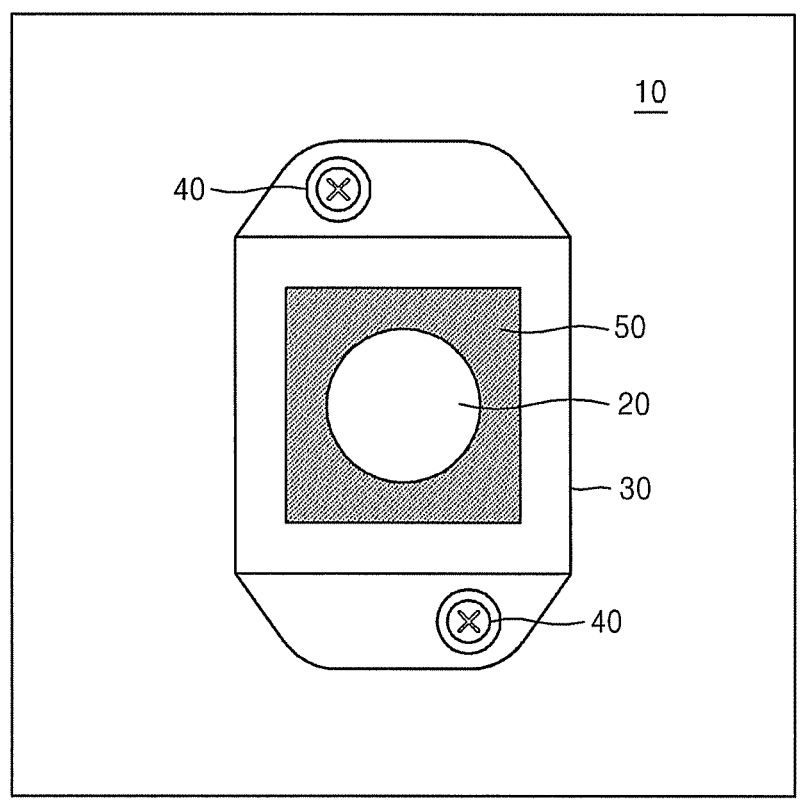
FIG. 3B is a plan view of FIG. 3A.

FIG. 3A is a cross-sectional view of a structure for fixing a camera module on a biodrive, illustrating a buffer material provided between a holder member and the camera module, according to an example embodiment, and FIG. 3B is a plan view of FIG. 3A.

Referring to FIGS. 3A and 3B, a buffer material 50 may be further provided in a space between a top surface of the camera module 20 and a bottom surface of the holder member 30 so that the buffer material 50 may absorb external pressure and shock applied to the camera module 20 to prevent distortion and deviation of the camera module 20. Also, even if the buffer material 50 is bonded under pressure to the camera module 20 to apply oscillation and shock to the camera module 20, the structure for fixing the camera module 20 on the biodrive according to the an embodiment may be highly stable.

Meanwhile, even if a direction of the camera module 20 is finely deviated during combination of the camera module 20 with the socket 11 or during a subsequent process of mounting the holder member 30 over the camera module 20, introduction of the buffer material 50 allows the camera module 20 to maintain a uniform horizontality degree with respect to the surface of the PCB 10. The horizontality degree of the camera module 20 with respect to the surface of the PCB 10 may be controlled to be 0.05° or less.

The buffer material 50 may be one selected from the group consisting of rubber, sponge, and polyester. Alternatively, the buffer material 50 may be any other material capable of absorbing shock.

Figure 4A:
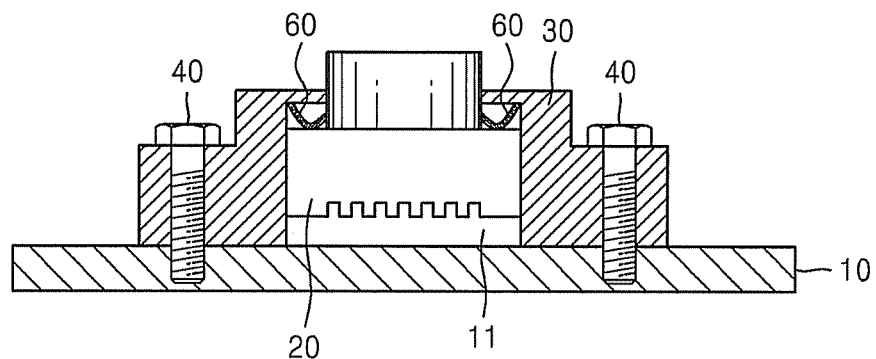
FIG. 4A is a cross-sectional view of a structure for fixing a camera module on a biodrive, illustrating a tension member connected to each of lower corners of a holder member, according to an example embodiment.
Figure 4B:
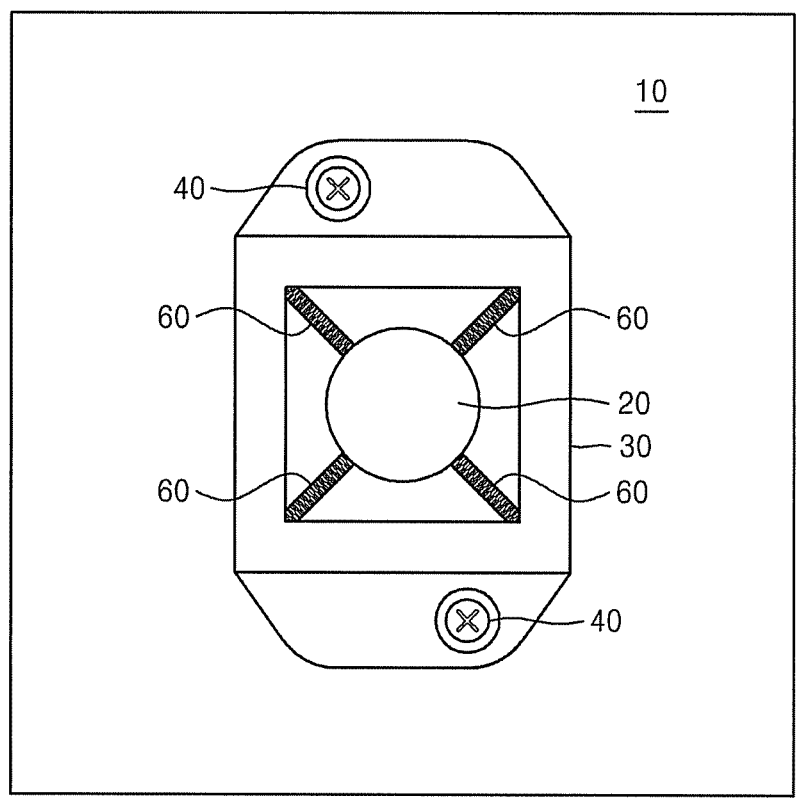
FIG. 4B is a plan view of FIG. 4A.

FIG. 4A is a cross-sectional view of a structure for fixing a camera module on a biodrive, illustrating a tension member connected to each of lower corners of a holder member, according to an example embodiment, and FIG. 4B is a plan view of FIG. 4A.

Referring to FIG. 4A, tension members 60 may be further provided in a space between the holder member 30 and the camera module 20. The tension members 60 may be connected to respective lower corners of the holder member 30 without using the buffer material 50. Thus, the tension members 60 may elastically apply pressure to the camera module 20 and absorb an external force and shock externally applied to the camera module 20, thereby preventing distortion and deviation of the camera module 20.

Meanwhile, the tension members 60 may be connected to the respective lower corners of the holder member 30 and bent in a V shape. The tension members 60 may apply pressure to the camera module 20 in both vertical and horizontal directions to prevent deviation of the camera module 20. However, the shape of the tension members 60 may be a V shape but is not limited to the V shape shown in FIG. 4A and may be variously changed.

The tension members 60 may be formed of a plastic material. Also, each of the tension members 60 may be a tension rib.

Figure 5A:
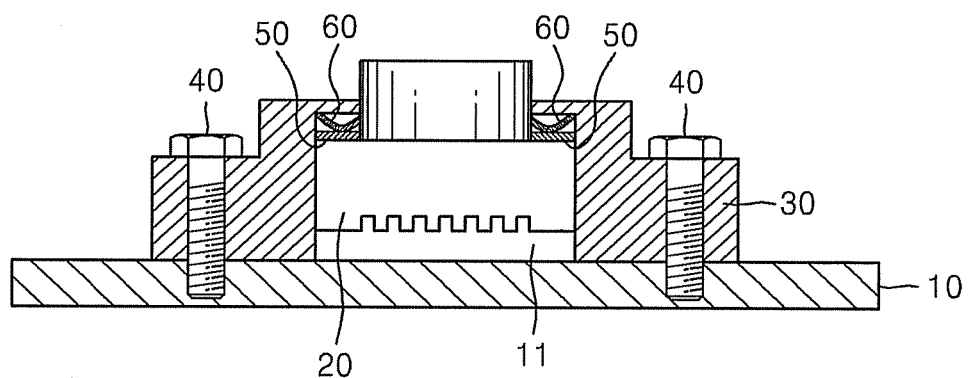
FIG. 5A is a cross-sectional view of a structure for fixing a camera module on a biodrive, illustrating both a buffer material and a tension member provided under a holder member, according to an example embodiment.
Figure 5B:
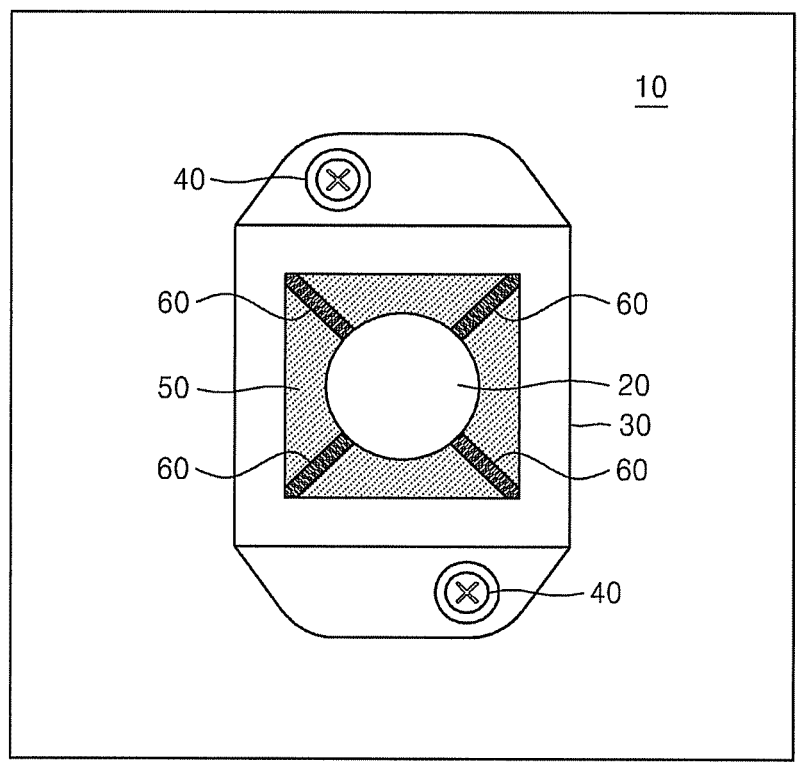
FIG. 5B is a plan view of FIG. 5A.

FIG. 5A is a cross-sectional view of a structure for fixing a camera module on a biodrive, illustrating both a buffer material and a tension member provided under a holder member, according to an example embodiment, and FIG. 5B is a plan view of FIG. 5A.

Referring to FIG. 5A, both a buffer material 50 and tension members 60 may be disposed under the holder member 30 and on the camera module 20. That is, the buffer material 50 may be provided in a space between the camera module 20 and the holder member 30, and the tension members 60 may be connected to respective lower corners of the holder member 30.

The tension members 60 connected to the respective lower corners of the holder member 30 may elastically apply pressure to the buffer material 50 and thus, absorb an external force and shock applied to the camera module 20, thereby effectively preventing deviation of the camera module 20.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A structure for fixing a camera module on a biodrive, the structure comprising:
    a socket fixed on a top surface of a printed circuit board (PCB) of the biodrive;
    the camera module combined with the socket, such that the socket is between the camera module and the biodrive;
    a holder member disposed over the camera module, directly covering the camera module; and
    a plurality of fixing units configured to fix the holder member to fix the camera module on the PCB.

2. The structure of claim 1, wherein a plurality of fixing holes are formed in upper and lower portions and/or both lateral portions of the holder member.

3. The structure of claim 2, wherein the upper and lower portions and/or both lateral portions of the holder member are disposed flat against the PCB, such that the fixing units combine the holder member with the PCB.

4. The structure of claim 1, wherein the PCB further comprises blind holes configured to fit to the plurality of fixing units.

5. The structure of claim 1, wherein the socket has a plurality of press-fit pins.

6. The structure of claim 5, wherein the camera module has a plurality of fixing pins to be combined with a plurality of press-fit pins of the socket.

7. The structure of claim 1, wherein a top surface of the camera module is spaced apart from a bottom surface of the holder member by about 0.1 to 0.15mm.

8. The structure of claim 1, wherein the cameral module has a horizontality degree of about 0.05° or less with respect to the surface of the PCB.

9. The structure of claim 1, further comprising a tension member connected to each of lower corners of the holder member and configured to elastically apply pressure to the camera module.

10. The structure of claim 9, wherein the tension member is a V shape.

11. The structure of claim 9, wherein the tension member is a tension rib formed of a plastic material.

12. The structure of claim 1, further comprising a buffer material provided in a space between a top surface of the camera module and a bottom surface of the holder member.

13. The structure of claim 12, further comprising a tension member connected to each of lower corners of the holder member and configured to elastically apply pressure to the buffer material.

14. The structure of claim 12, wherein the buffer material is formed of at least one selected from the group consisting of rubber, sponge, and polyester.

15. The structure of claim 1, wherein the holder member directly covers an entire side of the camera module.

* * * * *

UNITED STATES PATENT AND TRADEMARK OFFICE
CERTIFICATE OF CORRECTION

PATENT NO. : 8,531,594 B2  
APPLICATION NO. : 12/729478  
DATED : September 10, 2013  
INVENTOR(S) : Chung-ung Kim et al.

Page 1 of 1

It is certified that error appears in the above-identified patent and that said Letters Patent is hereby corrected as shown below:

On the Title Page, In Column 1, Item (75), (Inventors), Line 3, Delete "Yonging-si" and insert -- Yongin-si --, therefor.

Signed and Sealed this  
Eleventh Day of February, 2014

Michelle K. Lee  
*Deputy Director of the United States Patent and Trademark Office*